United States Patent
Kim et al.

(10) Patent No.: US 12,287,568 B2
(45) Date of Patent: Apr. 29, 2025

(54) LOW-TEMPERATURE DIRECT GROWTH METHOD OF MULTILAYER GRAPHENE, PELLICLE FOR EXTREME ULTRAVIOLET LITHOGRAPHY USING THE SAME, AND METHOD FOR MANUFACTURING THE PELLICLE

(71) Applicant: KOREA ELECTRONICS TECHNOLOGY INSTITUTE, Seongnam-si (KR)

(72) Inventors: Hyeong Keun Kim, Yongin-si (KR); Seul Gi Kim, Yongin-si (KR); Hyun Mi Kim, Seoul (KR); Jin Woo Cho, Seoul (KR); Hye Young Kim, Bucheon-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 443 days.

(21) Appl. No.: 17/698,404

(22) Filed: Mar. 18, 2022

(65) Prior Publication Data

US 2022/0326602 A1    Oct. 13, 2022

(30) Foreign Application Priority Data

Apr. 8, 2021    (KR) .................... 10-2021-0045887

(51) Int. Cl.
*G03F 1/62* (2012.01)
*C01B 32/184* (2017.01)
(Continued)

(52) U.S. Cl.
CPC .............. *G03F 1/62* (2013.01); *C01B 32/184* (2017.08); *G03F 7/70033* (2013.01);
(Continued)

(58) Field of Classification Search
CPC ........................................................ G03F 1/62
See application file for complete search history.

(56) References Cited

U.S. PATENT DOCUMENTS

| 11,392,049 B2 | 7/2022 | Kim et al. |
| 11,789,359 B2 | 10/2023 | Kim et al. |
| (Continued) | | |

FOREIGN PATENT DOCUMENTS

| CN | 104477903 A | 4/2015 |
| JP | 2006-170916 A | 6/2006 |
| (Continued) | | |

OTHER PUBLICATIONS

Extended European Search Report in European Application No. 21207122.9 dated Mar. 25, 2022 in 10 pages.
(Continued)

*Primary Examiner* — Peter F Godenschwager
(74) *Attorney, Agent, or Firm* — Knobbe, Martnes, Olson, & Bear,, LP

(57) ABSTRACT

This application relates to a pellicle for extreme ultraviolet lithography and a manufacturing method thereof using the low-temperature direct growth method of multilayer graphene. In one aspect, the method includes forming an etch stopper on a substrate, forming a seed layer on the etch stopper, the seed layer including at least one of amorphous boron, BN, BCN, $B_4C$, or Me-X (Me is at least one of Si, Ti, Mo, or Zr, and X is at least one of B, C, or N). The method may also include forming a metal catalyst layer on the seed layer; forming an amorphous carbon layer on the metal catalyst layer, and directly growing multilayer graphene on the seed layer through interlayer exchange between the metal catalyst layer and the amorphous carbon layer by performing a low-temperature heat treatment at 450° C. to 600° C.

10 Claims, 14 Drawing Sheets

(51) Int. Cl.
*G03F 7/00* (2006.01)
*H01L 21/02* (2006.01)
*H01L 21/324* (2006.01)
*H01L 29/16* (2006.01)

(52) U.S. Cl.
CPC ...... *H01L 21/02214* (2013.01); *H01L 21/324* (2013.01); *H01L 29/1606* (2013.01)

(56) References Cited

U.S. PATENT DOCUMENTS

| | | |
|---|---|---|
| 2011/0206934 A1 | 8/2011 | Bol et al. |
| 2012/0267041 A1 | 10/2012 | Woo et al. |
| 2017/0205704 A1 | 7/2017 | Nikipelov et al. |
| 2019/0056654 A1 | 2/2019 | Peter et al. |
| 2019/0129299 A1 | 5/2019 | Nasalevich et al. |
| 2020/0406244 A1 | 12/2020 | Kurganova et al. |
| 2022/0146928 A1 | 5/2022 | Kim et al. |
| 2023/0125229 A1 | 4/2023 | Kim et al. |

FOREIGN PATENT DOCUMENTS

| | | |
|---|---|---|
| JP | 2018-035010 A | 3/2018 |
| JP | 2018-531426 A | 10/2018 |
| JP | 2020-098227 A | 6/2020 |
| KR | 1020170077207 A | 7/2017 |
| KR | 1020180072786 A | 6/2018 |
| KR | 10-1878733 B1 | 7/2018 |
| KR | 10-2018-0135490 A | 12/2018 |
| KR | 10-2019-0053706 A | 5/2019 |
| KR | 10-2020-0112756 A | 10/2020 |
| KR | 10-2020-0126216 A | 11/2020 |
| KR | 1020200130289 A | 11/2020 |
| WO | WO 2017/102379 A1 | 6/2017 |
| WO | WO 2017/122975 A1 | 7/2017 |
| WO | WO 2017/186486 A1 | 11/2017 |
| WO | WO 2019/170356 A1 | 9/2019 |

OTHER PUBLICATIONS

Extended European Search Report in corresponding European Application No. 21207713.5 dated Apr. 7, 2022.
Office Action dated Apr. 22, 2021 in Korean Application No. 10-2020-0148420.
Office Action in corresponding Japanese Application No. 2021-183857 dated Jan. 17, 2023.
Notice of Allowance in corresponding European Application No. 21207713.5 dated May 15, 2023.
Notice of Allowance dated Apr. 6, 2022 in U.S. Appl. No. 17/454,104.
Office Action dated Aug. 16, 2023 in U.S. Appl. No. 17/456,839.
Notice of Allowance dated Nov. 15, 2023 in U.S. Appl. No. 17/456,839.
Rodriguez-Mano et al., "Graphene growth by a metal-catalyzed solid-state transformation of amorphous carbon", ACS Nani, vol. 5 No.2: (Feb. 22, 2011); pp. 1529-1534.
Notice of Allowance dated Jul. 14, 2023 in Korean Application No. 10-2021-0045887.
Weatherup, Robert S., et al. "Introducing carbon diffusion barriers for uniform, high-quality graphene growth from solid sources." Nano letters 13.10 (Sep. 11, 2013): 4624-4631.
Office Action in Korean Application No. 10-2021-0045887 dated Jan. 9, 2023 and English machine translation.
Office Action dated Apr. 21, 2021 in Korean Application No. 10-2020-0149813.
Notice of Allowance dated Jul. 19, 2021 in Korean Application No. 10-2020-0149813.

LOW-TEMPERATURE DIRECT GROWTH METHOD OF MULTILAYER GRAPHENE, PELLICLE FOR EXTREME ULTRAVIOLET LITHOGRAPHY USING THE SAME, AND METHOD FOR MANUFACTURING THE PELLICLE

CROSS-REFERENCE TO RELATED APPLICATION

The present application claims priority to Korean Patent Application No. 10-2021-0045887 filed on Apr. 8, 2021 in the Korean Intellectual Property Office, which is incorporated herein in its entirety by reference.

BACKGROUND

Technical Field

The present disclosure relates to a semiconductor lithography technology. More particularly, the present disclosure relates to a method for directly growing multilayer graphene used as a core layer of a pellicle for extreme ultraviolet lithography at a low temperature, and also relates to the pellicle for extreme ultraviolet lithography and manufacturing method thereof using the low-temperature direct growth method of multilayer graphene.

Description of Related Technology

As the semiconductor industry continues to develop and the degree of semiconductor integration is dramatically improved, electronic devices are becoming smaller and lighter. In order to further improve the degree of semiconductor integration, the advancement of lithography technology is required.

Currently, technology is developing toward realizing a fine pattern of a semiconductor by reducing the wavelength of light. Extreme ultraviolet (EUV) lithography technology, recently developed as a next-generation technology, can realize a fine pattern through a single resist process.

SUMMARY

The present disclosure provides a method for directly growing multilayer graphene used as a core layer of a pellicle for extreme ultraviolet lithography at a low temperature, thus simplifying a manufacturing process of the multilayer graphene.

In addition, the present disclosure provides a pellicle for extreme ultraviolet lithography using the low-temperature direct growth method of multilayer graphene, thus realizing thermal stability, mechanical stability, and chemical durability while having a high extreme ultraviolet transmittance.

In addition, the present disclosure provides a method for manufacturing the pellicle for extreme ultraviolet lithography by using the low-temperature direct growth method of multilayer graphene.

According to embodiments of the present disclosure, a low-temperature direct growth method of multilayer graphene may include forming an etch stopper on a substrate; forming a seed layer on the etch stopper, the seed layer being made of a material including at least one of amorphous boron, BN, BCN, $B_4C$, and Me-X (Me is at least one of Si, Ti, Mo, and Zr, and X is at least one of B, C, and N); forming a metal catalyst layer on the seed layer; forming an amorphous carbon layer on the metal catalyst layer; and directly growing multilayer graphene on the seed layer through interlayer exchange between the metal catalyst layer and the amorphous carbon layer by performing a low-temperature heat treatment at 450 to 600° C.

In the method, a material of the etch stopper may include at least one of $SiN_x$, $SiO_2$, SiC, and $Mo_2C$.

In the method, the seed layer may be formed by depositing to a thickness of 5 nm or less.

In the method, a material of the metal catalyst layer may include at least one of Ni, Co, Fe, Pt, Ir, Ru, Cr, and Mn.

In the method, the metal catalyst layer may be formed to have a thickness of 10 nm to 100 nm by a sputtering process or an e-beam evaporation process.

In the method, a ratio ($t_{a-c}/t_m$) of the amorphous carbon layer thickness ($t_{a-c}$) to the metal catalyst layer thickness ($t_m$) may be 0.9 or more.

In the method, when directly growing the multilayer graphene, the heat treatment may be performed for 30 minutes to 4 hours in a hydrogen gas and inert gas atmosphere, and the inert gas includes at least one of nitrogen, argon, and helium.

The method may further include, after directly growing the multilayer graphene, removing the metal catalyst layer on the multilayer graphene.

The method may further include, after directly growing the multilayer graphene and before removing the metal catalyst layer, removing the amorphous carbon layer remaining on the metal catalyst layer through $O_2$ plasma treatment.

In the method, the multilayer graphene may have a thickness of 20 nm or less.

According to embodiments of the present disclosure, a method for manufacturing a pellicle for extreme ultraviolet lithography by using a low-temperature direct growth method of multilayer graphene may include forming a core layer by directly growing multilayer graphene on a substrate at a low temperature; forming a capping layer on the core layer; and forming an opening for partially exposing the core layer by removing a central portion of the substrate under the core layer. In particular, forming the core layer may include forming an etch stopper on the substrate; forming a seed layer on the etch stopper, the seed layer being made of a material including at least one of amorphous boron, BN, BCN, $B_4C$, and Me-X (Me is at least one of Si, Ti, Mo, and Zr, and X is at least one of B, C, and N); forming a metal catalyst layer on the seed layer; forming an amorphous carbon layer on the metal catalyst layer; directly growing the multilayer graphene on the seed layer through interlayer exchange between the metal catalyst layer and the amorphous carbon layer by performing a low-temperature heat treatment at 450 to 600° C.; and removing the metal catalyst layer on the multilayer graphene.

In the method, the multilayer graphene of the core layer may have a thickness of 20 nm or less.

In the method, the opening may be formed by removing the central portion of the substrate under the etch stopper.

In the method, a material of the capping layer may include at least one of $SiN_x$, BN, Si—BN, Me-Y (Me is at least one of Zr and Mo, and Y is at least one of boride, nitride, and carbide), $ZrSi_2$, $ZrB_x$ ($2 \leq x < 16$), and $ZrB_xSi_y$ ($x \geq 2$, $y \geq 2$).

In the method, the capping layer may be formed on the core layer to have a thickness of 1 nm to 10 nm by an atomic layer deposition (ALD) process, an e-beam evaporation process, a sputtering process, or a chemical vapor deposition (CVD) process.

According to embodiments of the present disclosure, a pellicle for extreme ultraviolet lithography may include a substrate having an opening formed in a central portion; an etch stopper formed on the substrate to cover the opening; a seed layer formed on the etch stopper and made of a material including at least one of amorphous boron, BN, BCN, B$_4$C, and Me-X (Me is at least one of Si, Ti, Mo, and Zr, and X is at least one of B, C, and N); a core layer formed of directly grown multilayer graphene on the seed layer; and a capping layer formed on the core layer.

In the pellicle, a metal catalyst layer and an amorphous carbon layer may be sequentially formed on the seed layer, and the multilayer graphene may be directly grown on the seed layer through interlayer exchange between the metal catalyst layer and the amorphous carbon layer in a low-temperature heat treatment at 450 to 600° C.

According to the present disclosure, it is possible to directly grow the multilayer graphene on the seed layer by means of the interlayer exchange between the metal catalyst layer and the amorphous carbon layer through low-temperature heat treatment based on the seed layer made of a material including at least one of amorphous boron, BN, BCN, B$_4$C, and Me-X (Me is at least one of Si, Ti, Mo, and Zr, and X is at least one of B, C, and N). That is, when the seed layer, the metal catalyst layer, and the amorphous carbon layer are sequentially formed on the etch stopper of the silicon substrate and then subjected to low-temperature heat treatment, carbon in the amorphous carbon layer is transferred onto the seed layer by the interlayer exchange between the metal catalyst layer and the amorphous carbon layer and thus is directly grown into the multilayer graphene.

According to the present disclosure, the seed layer is formed of a material that does not react with the metal catalyst layer, and functions as a seed during the interlayer exchange. In addition, the seed layer increases the bonding strength between the directly grown multilayer graphene and the silicon substrate, so that it can suppress the separation of the core layer made of the directly grown multilayer graphene from the silicon substrate when the pellicle is used in an extreme ultraviolet lithography environment.

According to the present disclosure, by forming the thickness of the seed layer to be 5 nm or less and adjusting the ratio $(t_{a-c}/t_m)$ of the amorphous carbon layer thickness $(t_{a-c})$ to the metal catalyst layer thickness $(t_m)$ to be 0.9 or more, it is possible to directly grow the multilayer graphene on the seed layer by the interlayer exchange between the metal catalyst layer and the amorphous carbon layer at a low temperature of 450 to 600° C. As such, even though in the present disclosure the heat treatment is performed at a low temperature of 450 to 600° C. which is lower than a typical heat treatment temperature of 700° C. for growing the multilayer graphene, full-scale interlayer exchange occurs smoothly. It is therefore possible to directly grow the multilayer graphene having a uniform thickness over a large area.

According to the present disclosure, because the multilayer graphene can be directly grown on the silicon substrate without a transfer process, it is possible to manufacture the pellicle for extreme ultraviolet lithography of a full size by using the multilayer graphene directly grown on the silicon substrate as the core layer. That is, the low-temperature direct growth method of multilayer graphene according to the present disclosure can solve a problem of a typical transfer process.

The pellicle manufactured by the above-described manufacturing method of the present disclosure includes the multilayer graphene as the core layer, so it can provide thermal stability, mechanical stability, and chemical durability while having a high extreme ultraviolet transmittance of 85% or more.

The etch stopper formed on the silicon substrate uses a material having resistance to KOH, and also functions to prevent the material of the metal catalyst layer from being diffused into the silicon substrate.

Even though the multilayer graphene according to the present disclosure is used as the core layer and also the etch stopper and the capping layer are formed as protective layers on both sides of the core layer, the pellicle according to the present disclosure can provide a higher extreme ultraviolet transmittance of 85% or more when the core layer has a thickness of 10 nm to 20 nm.

Accordingly, the pellicle using the multilayer graphene according to the present disclosure as the core layer can provide an extreme ultraviolet transmittance of 85% or more and a reflectance of 0.05% or less.

In addition, because the capping layer is formed by an atomic layer deposition (ALD) process, an e-beam evaporation process, a sputtering process, or a chemical vapor deposition (CVD) process so as to have the best transmittance and minimize defects through free control of thickness, physical properties, and chemical composition.

DETAILED DESCRIPTION

Figure 1:
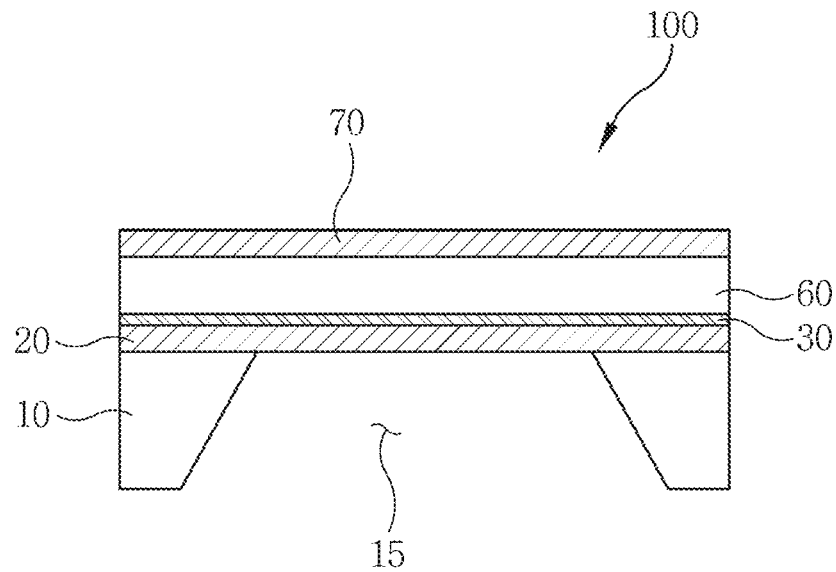
FIG. 1 is a cross-sectional view showing a pellicle for extreme ultraviolet lithography using multilayer graphene directly grown at a low temperature according to the present disclosure.

An extreme ultraviolet lithography apparatus used in a semiconductor process includes a light source power, a resist, a pellicle, and a mask. The pellicle is installed on the mask to prevent contaminants generated during the lithography process from adhering to the mask, and is selectively used depending on the lithography machine.

In the extreme ultraviolet lithography process, there was an expectation that the pellicle would not be needed because a clean system was built. However, it has been known that during an actual operation after the construction of the lithography apparatus, contamination of the mask is caused by foreign substances generated from an internal driving unit of the apparatus, particles of tin generated in the oscillation of the light source, and extreme ultraviolet photoresist.

Therefore, in the extreme ultraviolet lithography process, the pellicle is recognized as an essential component so as to prevent contamination of the mask. When the pellicle is used, defects smaller than 10,000 nm in size are negligible.

The pellicle for extreme ultraviolet lithography is required to have a size of 110 mm×144 mm to cover the mask, and an extreme ultraviolet transmittance of 90% or more is required in order to minimize deterioration of productivity due to loss of a light source. In addition, mechanical stability that the pellicle is not damaged by physical movement up to 20 G inside the extreme ultraviolet lithography apparatus, and thermal stability that the pellicle can withstand a thermal load of 250 W or more based on a 5 nm node are required. Also, chemical durability that the pellicle does not react to hydrogen radicals generated in an extreme ultraviolet environment is required.

Currently, pellicle development companies are developing transmissive materials based on polycrystalline silicon (p-Si) or SiN. However, such materials do not satisfy a transmittance of 85% or more, which is the most important condition of a pellicle for extreme ultraviolet lithography. Also, such materials have weaknesses in thermal stability, mechanical stability, and chemical durability in an extreme ultraviolet lithography environment, so that process development research is being conducted to supplement their properties. For example, materials such as Mo, Ru, and Zr have been selected and studied as materials for solving the problems of SiN-based materials, but it is difficult to manufacture a thin film and maintain its shape.

In order to address the above-discussed issue, a graphene-based pellicle for extreme ultraviolet lithography has been introduced. Graphene has a transmittance of 85% or more for extreme ultraviolet rays. In addition, graphene has very high tensile strength when base planes are uniformly arranged in the areal direction, so it can satisfy all characteristic indicators such as high transmittance, thermal stability, and mechanical stability.

However, due to the complexity of a manufacturing process and the difficulty in quality control, graphene has not yet been implemented with a full-size membrane.

In a conventional method of manufacturing graphene for a pellicle, a nickel foil or a nickel thin film is placed in a vapor deposition apparatus and heat-treated in an atmosphere containing hydrogen and methane. Then, graphene is grown on the surface, and when nickel is etched using an aqueous iron chloride solution or the like, graphene of a separated thin film can be obtained.

Unfortunately, this method requires several steps, such as coating polymethyl methacrylate (PMMA) as a support layer and etching a metal catalyst, in a transfer process after graphene growth. In addition, there is a possibility that a free-standing graphene thin film may be broken during a process of immersion in acetone to remove PMMA and a process of metal catalyst etching, or wrinkling may occur in transferred to another substrate. Therefore, there is a limit to large-area realization and mass production.

Hereinafter, an embodiment of the present disclosure will be described in detail with reference to the accompanying drawings. The present disclosure may, however, be embodied in many different forms and should not be construed as being limited to the embodiment set forth herein. Rather, this embodiment is provided so that the disclosure will be thorough and complete and will fully convey the scope of the disclosure to those skilled in the art. Accordingly, an embodiment described herein should be understood to include various modifications, equivalents, and/or alternatives.

In addition, techniques that are well known in the art and not directly related to the present disclosure are not described herein. This is to clearly convey the subject matter of the present disclosure by omitting an unnecessary explanation. Also, the terms are merely used for describing a particular embodiment but do not limit the embodiment. Singular forms are intended to include plural forms unless the context clearly indicates otherwise.

[Pellicle for Extreme Ultraviolet Lithography]

FIG. 1 is a cross-sectional view showing a pellicle for extreme ultraviolet lithography using multilayer graphene directly grown at a low temperature according to the present disclosure.

Referring to FIG. 1, a pellicle 100 for extreme ultraviolet lithography according to the present disclosure (hereinafter referred to as 'pellicle') includes a silicon substrate 10, a seed layer 30, a core layer 60, and a capping layer 70. The silicon substrate 10 has an opening 15 formed in a central portion. The seed layer 30, the core layer 60, and the capping layer 70 are formed on the silicon substrate 10 so as to cover the opening 15.

The pellicle 100 is a consumable component that protects a mask from contaminants in a lithography process for semiconductor or display manufacturing. That is, the pellicle 100 is a thin film overlying the mask and serves as a cover. Because the light transferred to the wafer is focused with the mask in a lithographic exposure, even if contaminants exist on the pellicle 100 that is separated by a certain distance, it is possible to minimize a problem of forming a defective pattern due to out of focus.

As such, the pellicle 100 may minimize defective patterns while protecting the mask from contaminants during the exposure process, thereby greatly increasing the yield of semiconductor or display manufacturing. In addition, the use of the pellicle 100 can increase the lifespan of the mask.

Now, the pellicle 100 according to the present disclosure will be described in detail.

The silicon substrate 10 supports the seed layer 30, the core layer 60, and the capping layer 70 and makes it easy to handle and transport the pellicle 100 during and after the process of manufacturing the pellicle 100. The silicon substrate 10 may be formed of a material available for an etching process.

An etch stopper 20 is formed on the silicon substrate 10. The seed layer 30 is formed on the etch stopper 20.

The etch stopper 20 is formed of a material having resistance to KOH, and also functions to prevent the material of a metal catalyst layer from being diffused into the silicon substrate 10. The material of the etch stopper 20 may include at least one of $SiN_x$, $SiO_2$, SiC, and $Mo_2C$. Here, $SiN_x$ may include $Si_3N_4$. The etch stopper 20 may be formed by a chemical vapor deposition (CVD) process, but it is formed by an atomic layer deposition (ALD), e-beam evaporation, or sputtering process so as to have the best transmittance and minimize defects through free control of thickness, physical properties, and chemical composition. The etch stopper 20 may be formed on the silicon substrate 10 to have a thickness of 1 nm to 10 nm. The etch stopper 20 may be formed to have a thickness corresponding to the capping layer 70.

The opening 15 in the central portion of the silicon substrate 10 may be formed using a micro-machining technique such as micro-electro mechanical systems (MEMS). That is, the opening 15 is formed by removing the central portion of the silicon substrate 10 under the etch stopper 20 by means of the micro-machining technique. The opening 15 partially exposes the etch stopper 20 under the core layer 60.

The seed layer 30 is formed of a material that does not react with the material of the metal catalyst layer, lowers a heat treatment temperature as a seed for interlayer exchange, and increases the bonding strength between the core layer 60, formed of multilayer graphene, and the silicon substrate 10.

The material of the seed layer 30 includes at least one of amorphous boron, BN, BCN, $B_4C$, and Me-X (Me is at least one of Si, Ti, Mo, and Zr, and X is at least one of B, C, and N). The seed layer 30 may be formed by depositing on the etch stop layer 20 to a thickness of 5 nm or less. The seed layer 30 may be formed using various deposition methods such as sputtering, CVD, and ALD.

The core layer 60 is formed on the seed layer 30. The core layer 60 is a layer that determines the transmittance of extreme ultraviolet rays, and is formed of multilayer graphene. The core layer 60 has a transmittance of 85% or more for extreme ultraviolet rays, and effectively dissipates heat to prevent overheating. The core layer 60 may have a thickness greater than the sum of the thicknesses of the etch stopper 20 and the capping layer 30. For example, the core layer 60 is formed to have a thickness of 20 nm or less.

The multilayer graphene forming the core layer 60 is formed by direct growth on the seed layer 30 through interlayer exchange by low-temperature heat treatment. The low-temperature direct growth method of multilayer graphene according to the present disclosure will be described in the manufacturing method of the pellicle 100.

The capping layer 70 provides thermal stability, mechanical stability, and chemical durability to the core layer 60 while minimizing a decrease in the transmittance of the core layer 60 for extreme ultraviolet rays. Specifically, the capping layer 70 is a protective layer for the core layer 60 and provides thermal stability by effectively dissipating heat generated in the core layer 60 to the outside. In addition, the capping layer 70 provides mechanical stability by supplementing the mechanical strength of the core layer 60. In addition, the capping layer 70 is formed of a material having resistance to KOH and provides chemical durability by protecting the core layer 60 from hydrogen radicals and oxidation.

The material of the capping layer 70 may include at least one of $SiN_x$, BN, Si—BN, Me-Y (Me is at least one of Zr and Mo, and Y is at least one of boride, nitride, and carbide), $ZrSi_2$, $ZrB_x$ ($2 \leq x < 16$), and $ZrB_xSi_y$ ($x \geq 2$, $y \geq 2$). The capping layer 70 may be formed by a CVD process, but it is formed by an ALD, e-beam evaporation, or sputtering process so as to have the best transmittance and minimize defects through free control of thickness, physical properties, and chemical composition. The capping layer 70 may be formed on the core layer 60 to have a thickness of 1 nm to 10 nm. Preferably, the capping layer 70 is formed with a thickness of 2 nm to 4 nm on the core layer 60.

[Method for Manufacturing a Pellicle for Extreme Ultraviolet Lithography Using a Low-Temperature Direct Growth Method of Multilayer Graphene]

Figure 2:
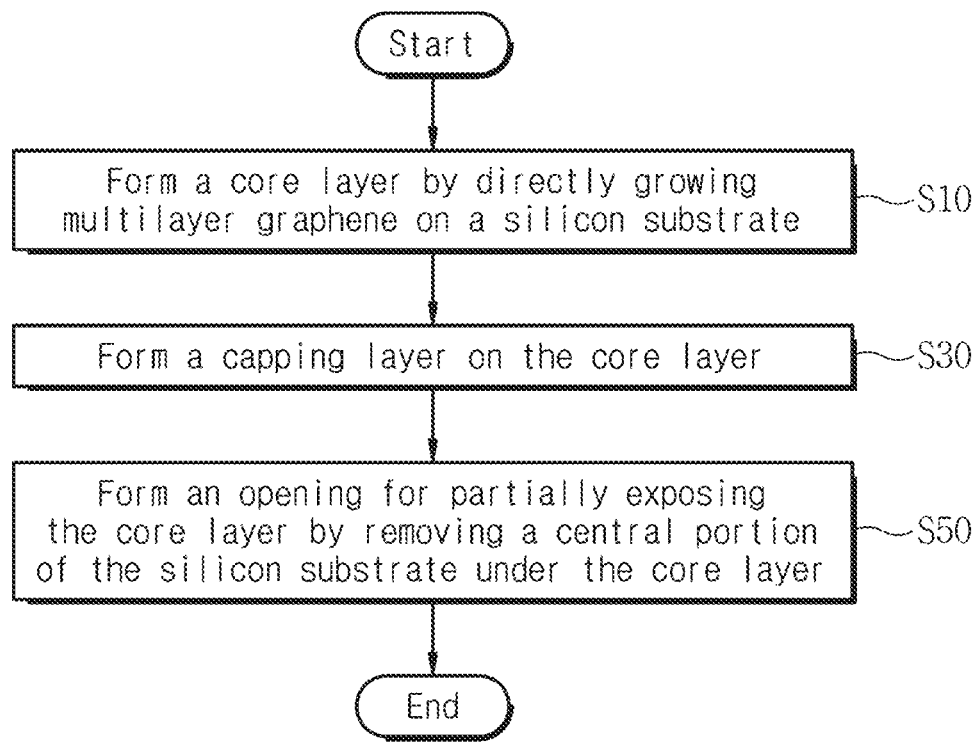
FIG. 2 is a flowchart showing a method of manufacturing a pellicle for extreme ultraviolet lithography using a low-temperature direct growth method of multilayer graphene according to the present disclosure.
Figure 3:
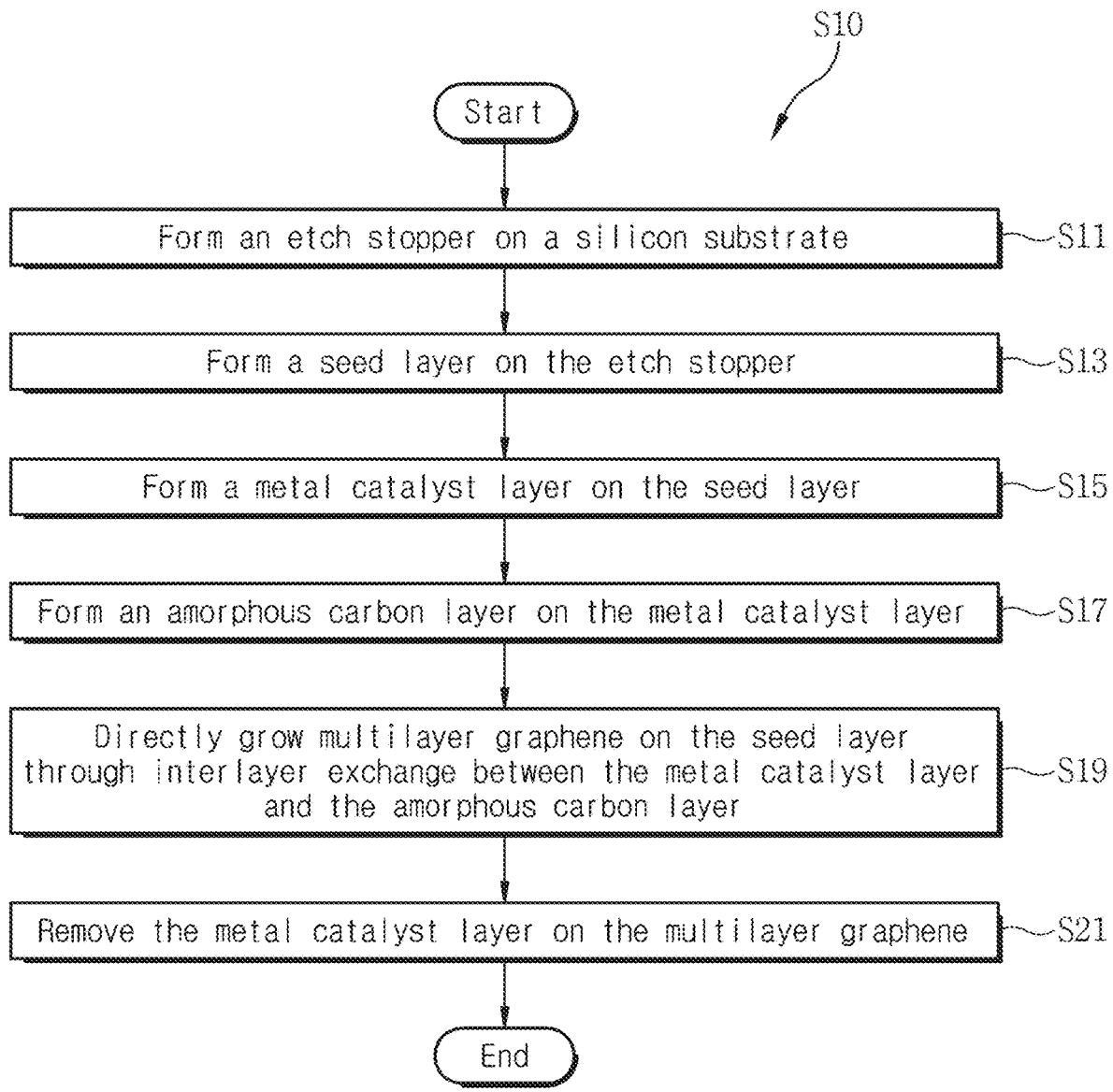
FIG. 3 is a detailed flowchart showing the step of forming the core layer of FIG. 2.

Hereinafter, a method for manufacturing the pellicle 100 according to the present disclosure will be described with reference to FIGS. 2 and 3. FIG. 2 is a flowchart showing a method of manufacturing a pellicle for extreme ultraviolet lithography using a low-temperature direct growth method of multilayer graphene according to the present disclosure. FIG. 3 is a detailed flowchart showing the step of forming the core layer of FIG. 2.

The method for manufacturing a pellicle according to the present disclosure includes a step S10 of forming a core layer by directly growing multilayer graphene on a silicon substrate at a low temperature, a step S30 of forming a capping layer on the core layer, and a step S50 of forming an opening for partially exposing the core layer by removing a central portion of the silicon substrate under the core layer.

The step S10 of forming the core layer includes a step S11 of forming an etch stopper on the silicon substrate, a step S13 of forming a seed layer on the etch stopper, a step S15 of forming a metal catalyst layer on the seed layer, a step S17 of forming an amorphous carbon layer on the metal catalyst layer, and a step S19 of directly growing multilayer graphene by interlayer exchange between the metal catalyst layer and the amorphous carbon layer through low-temperature heat treatment. Then, after the step S19 of directly growing the multilayer graphene, a step S21 of removing the metal catalyst layer on the multilayer graphene is performed to resultantly obtain the core layer formed of multilayer graphene.

Hereinafter, the above respective steps of the method for manufacturing the pellicle 100 according to the present disclosure will be described with reference to FIGS. 2 to 9. FIGS. 4 to 9 are views showing respective steps in the manufacturing method shown in FIGS. 2 and 3. FIGS. 5 to 8 are enlarged views of part 'A' of FIG. 4.

As shown in FIGS. 4 to 7, at the step S10, a core layer 60 is formed on a silicon substrate 10 through a low-temperature direct growth of multilayer graphene 61.

Figure 4:
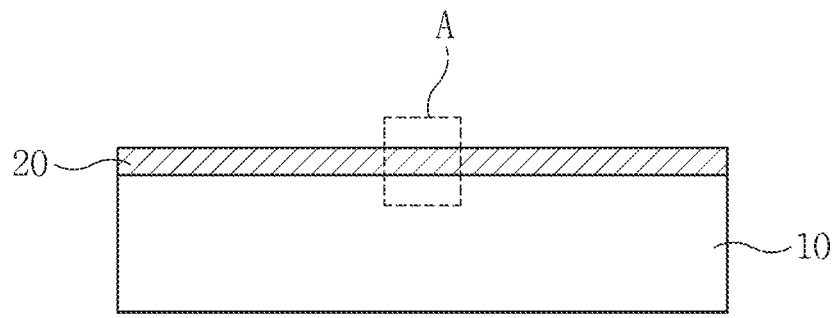
FIGS. 4 to 9 are views showing respective steps in the manufacturing method shown in FIGS. 2 and 3.

First, as shown in FIG. 4, at the step S11, an etch stopper 20 is formed on the silicon substrate 10. The etch stopper 20 may be formed by a CVD process, but it is formed by an ALD, e-beam evaporation, or sputtering process so as to have the best transmittance and minimize defects through free control of thickness, physical properties, and chemical composition. The material of the etch stopper 20 may include at least one of $SiN_x$, $SiO_2$, SiC, and $Mo_2C$. For example, the etch stopper 20 may be formed of $Si_3N_4$ belonging to $SiN_x$.

Figure 5:
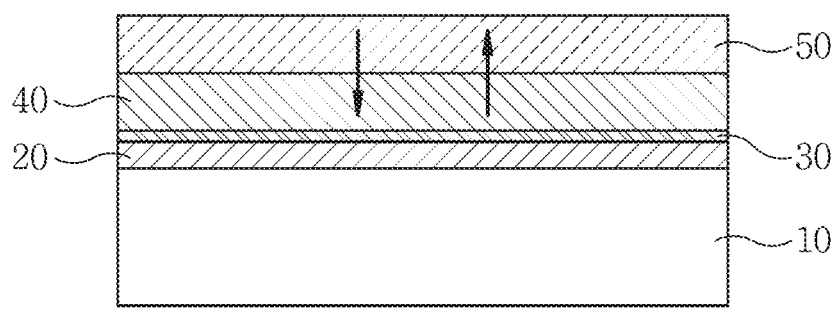

Next, as shown in FIG. 5, at the steps S13 to S17, a seed layer 30, a metal catalyst layer 40, and an amorphous carbon layer 50 are sequentially stacked on the etch stopper 20 of the silicon substrate 10.

Specifically, at the step S13, the seed layer 30 is formed on the etch stopper 20. The material of the seed layer 30 includes at least one of amorphous boron, BN, BCN, $B_4C$, and Me-X (Me is at least one of Si, Ti, Mo, and Zr, and X is at least one of B, C, and N). The seed layer 30 may be formed using various deposition methods such as sputtering, CVD, and ALD.

In addition, at the step S15, the metal catalyst layer 40 is formed on the seed layer 30. The material of the metal catalyst layer 40 may include at least one of Ni, Co, Fe, Pt, Ir, Ru, Cr, and Mn.

The metal catalyst layer 40 is formed to have a thickness of 10 nm to 100 nm by a sputtering process or an e-beam evaporation process.

In addition, at the step S17, the amorphous carbon layer 50 is formed on the metal catalyst layer 40. That is, the amorphous carbon layer 50 is formed to have a thickness of 10 nm to 100 nm by the sputtering process.

Figure 6:
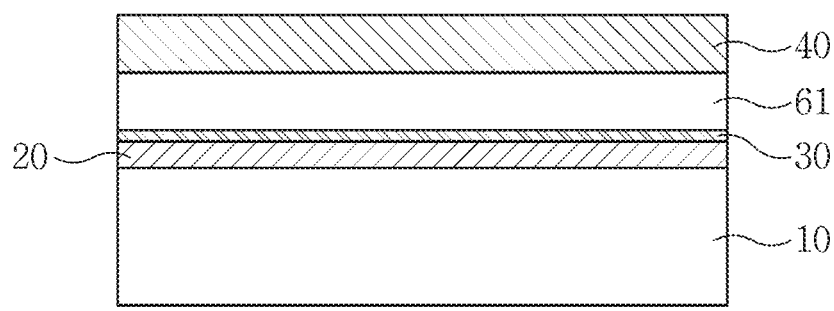

Next, as shown in FIGS. 5 and 6, at the step S19, the multilayer graphene 61 is directly grown on the seed layer 30 by interlayer exchange between the metal catalyst layer 40 and the amorphous carbon layer 50 through low-temperature heat treatment.

As such, based on the seed layer 30 on the silicon substrate 10, the multilayer graphene 61 may be directly grown by means of the interlayer exchange through low-temperature heat treatment. That is, when the metal catalyst layer 40 and the amorphous carbon layer 50 are sequentially formed on the seed layer 30 and then subjected to low-temperature heat treatment, carbon in the amorphous carbon layer 50 is transferred onto the seed layer 30 by the interlayer exchange and directly grown into the multilayer graphene 61.

Thermodynamically, a driving force of the interlayer exchange is because the Gibbs free energy is lowered when the amorphous carbon becomes a crystalline state. The seed layer 30 is formed of a material that does not react with the material of the metal catalyst layer 40, lowers a heat treatment temperature as a seed for the interlayer exchange, and increases the bonding strength between the core layer 60, formed of the multilayer graphene 61, and the silicon substrate 10.

Therefore, if the seed layer 30 is placed under the metal catalyst layer 40, the interlayer exchanges can occur wholly and smoothly even if the heat treatment is performed at a temperature of 450 to 600° C. lower than a typical heat treatment temperature for growing the multilayer graphene. The heat treatment according to the present disclosure may be performed at 450 to 600° C. for 30 minutes to 4 hours in a hydrogen gas and inert gas atmosphere. The inert gas may include at least one of nitrogen, argon, and helium.

If the heat treatment temperature is less than 450° C., the interlayer exchange may not be smoothly performed, and furthermore, the interlayer exchange may not occur at 400° C. or less. Although the heat treatment may be performed at a temperature exceeding 600° C., the multilayer graphene 61 in the present disclosure can be grown through heat treatment even at 600° C. or less.

As such, because the multilayer graphene 61 can be directly grown on the silicon substrate 10 at a low temperature, the manufacturing process of the multilayer graphene 61 can be simplified in manufacturing the pellicle.

In addition, because the etch stopper 20 and the seed layer 30 function as a diffusion barrier that prevents metal of the metal catalyst layer 40 from diffusing into the silicon substrate 10 during the heat treatment process, the quality of the multilayer graphene 61 directly grown on the silicon substrate 10 can be improved.

In order to directly and uniformly grow the multilayer graphene 61 on the seed layer 30 through interlayer exchange between the metal catalyst layer 40 and the amorphous carbon layer 50, it is necessary to maintain the ratio $(t_{a-c}/t_m)$ of the amorphous carbon layer thickness $(t_{a-c})$ to the metal catalyst layer thickness $(t_m)$ at 0.9 or more. If the thickness ratio $(t_{a-c}/t_m)$ is less than 0.9, the interlayer exchange between the metal catalyst layer 40 and the amorphous carbon layer 50 does not proceed smoothly. Unfortunately, this may cause the multilayer graphene 61 not to be uniformly grown on the seed layer 30 or some material of the metal catalyst layer 40 to remain in the seed layer 30.

If the thickness ratio $(t_{a-c}/t_m)$ is 0.9 or more, it is possible to directly grow the uniform multilayer graphene 61 through the interlayer exchange. However, if the amorphous carbon layer thickness $(t_{a-c})$ is too large compared to the metal catalyst layer thickness $(t_m)$, the amorphous carbon layer 50 may remain on the metal catalyst layer 40 after the interlayer exchange. Therefore, it is necessary to appropriately adjust the thickness ratio $(t_{a-c}/t_m)$ in consideration of a target thickness of the multilayer graphene 61 to be grown.

Figure 7:
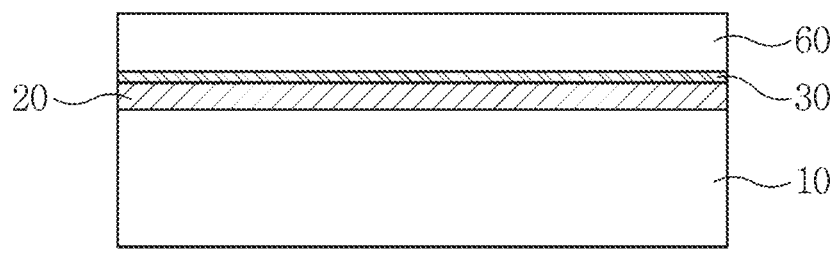

Next, as shown in FIG. 7, at the step S21, the metal catalyst layer (40 in FIG. 6) on the multilayer graphene (61 in FIG. 6) is removed, so that the core layer 60 formed of the multilayer graphene 61 is obtained. The metal catalyst layer 40 on the multilayer graphene 61 may be removed through selective etching of the metal catalyst layer 40.

As a method for removing the metal catalyst layer 40, wet etching may be used. As the etchant, $HNO_3$, $CH_3COOH$, $FeCl_3$, CAN, etc. may be used, for example.

Meanwhile, if the amorphous carbon layer 50 remains in part on the metal catalyst layer 40 after the above-described step S19 is performed, a process of completely removing the remaining amorphous carbon layer 50 from the metal catalyst layer 40 through $O_2$ plasma treatment may be performed before the step S21 is performed.

Figure 8:
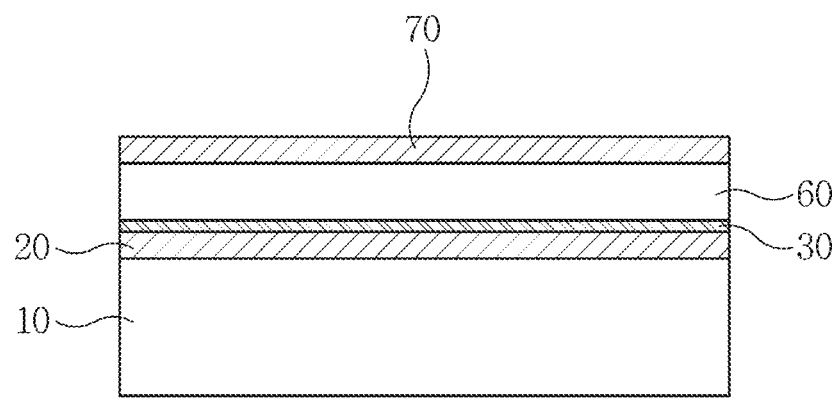

Subsequently, as shown in FIG. 8, at the step S30, the capping layer 70 is formed on the core layer 60. The capping layer 70 is formed with a thickness of 1 nm to 10 nm on the core layer 70 by the ALD, e-beam evaporation, or sputtering process. The capping layer 70 may be formed of a material including at least one of $SiN_x$, BN, Si—BN, Me-Y (Me is at least one of Zr and Mo, and Y is at least one of boride, nitride, and carbide), $ZrSi_2$, $ZrB_x$ ($2 \leq x < 16$), and $ZrB_xSi_y$ ($x \geq 2$, $y \geq 2$).

Figure 9:
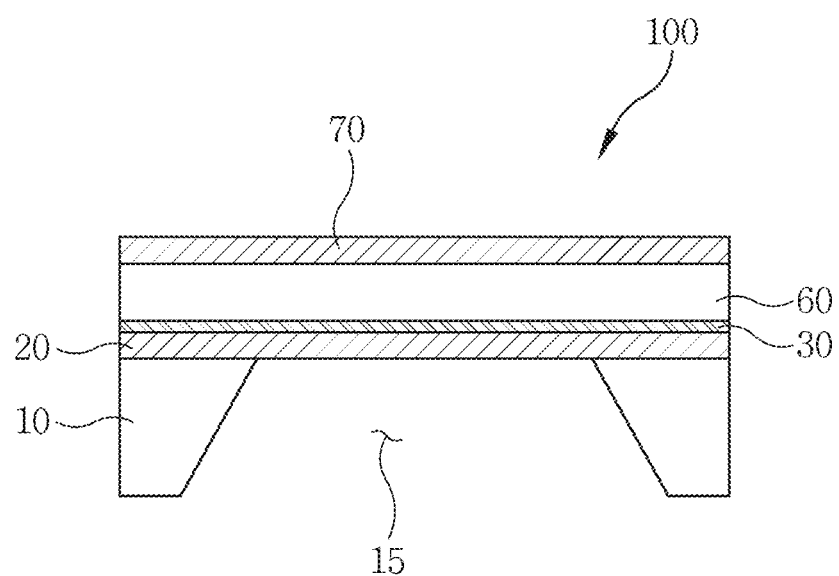

In addition, as shown in FIG. 9, at the step S50, the opening 15 through which the core layer 60 is partially exposed is formed by removing the central portion of the silicon substrate 10 under the core layer 60. As a result, the pellicle 100 according to the present disclosure is obtained. To form the opening 15, the central portion of the silicon substrate 10 under the etch stopper 20 is removed through a wet etching process. The opening 15 partially exposes the etch stopper 20 under the core layer 60.

As described above, according to the manufacturing method of the present disclosure, it is possible to directly grow the multilayer graphene 61 on the seed layer 30 by means of the interlayer exchange between the metal catalyst layer 40 and the amorphous carbon layer 50 through low-temperature heat treatment based on the seed layer 30. That is, when the seed layer 30, the metal catalyst layer 40, and the amorphous carbon layer 50 are sequentially formed on the etch stopper 20 of the silicon substrate 10 and then subjected to low-temperature heat treatment, carbon in the amorphous carbon layer 50 is transferred onto the seed layer 30 by the interlayer exchange between the metal catalyst layer 40 and the amorphous carbon layer 50 and thus is directly grown into the multilayer graphene 61.

According to the present disclosure, the seed layer 30 is formed of a material that does not react with the metal catalyst layer 40, and functions as a seed during the interlayer exchange. In addition, the seed layer 30 increases the bonding strength between the directly grown multilayer graphene 61 and the silicon substrate 10, so that it can suppress the separation of the core layer 60 made of the directly grown multilayer graphene 61 from the silicon substrate 10 when the pellicle 100 is used in an extreme ultraviolet lithography environment.

According to the present disclosure, by forming the thickness of the seed layer 30 to be 5 nm or less and adjusting the ratio ($t_{a-c}/t_m$) of the amorphous carbon layer thickness ($t_{a-c}$) to the metal catalyst layer thickness ($t_m$) to be 0.9 or more, it is possible to directly grow the multilayer graphene 61 on the seed layer 30 by the interlayer exchange between the metal catalyst layer 40 and the amorphous carbon layer 50 at a low temperature of 450 to 600° C. As such, even though in the present disclosure the heat treatment is performed at a low temperature of 450 to 600° C. which is lower than a typical heat treatment temperature of 700° C. for growing the multilayer graphene, full-scale interlayer exchange occurs smoothly. It is therefore possible to directly grow the multilayer graphene 61 having a uniform thickness over a large area.

According to the present disclosure, because the multilayer graphene 61 can be directly grown on the silicon substrate 10 without a transfer process, it is possible to manufacture the pellicle 100 for extreme ultraviolet lithography of a full size by using the multilayer graphene 61 directly grown on the silicon substrate 10 as the core layer 60.

The pellicle 100 manufactured by the above-described manufacturing method of the present disclosure includes the multilayer graphene 61 as the core layer 60, so it can provide thermal stability, mechanical stability, and chemical durability while having a high extreme ultraviolet transmittance of 85% or more.

EMBODIMENTS AND COMPARATIVE EXAMPLES

Figure 10:
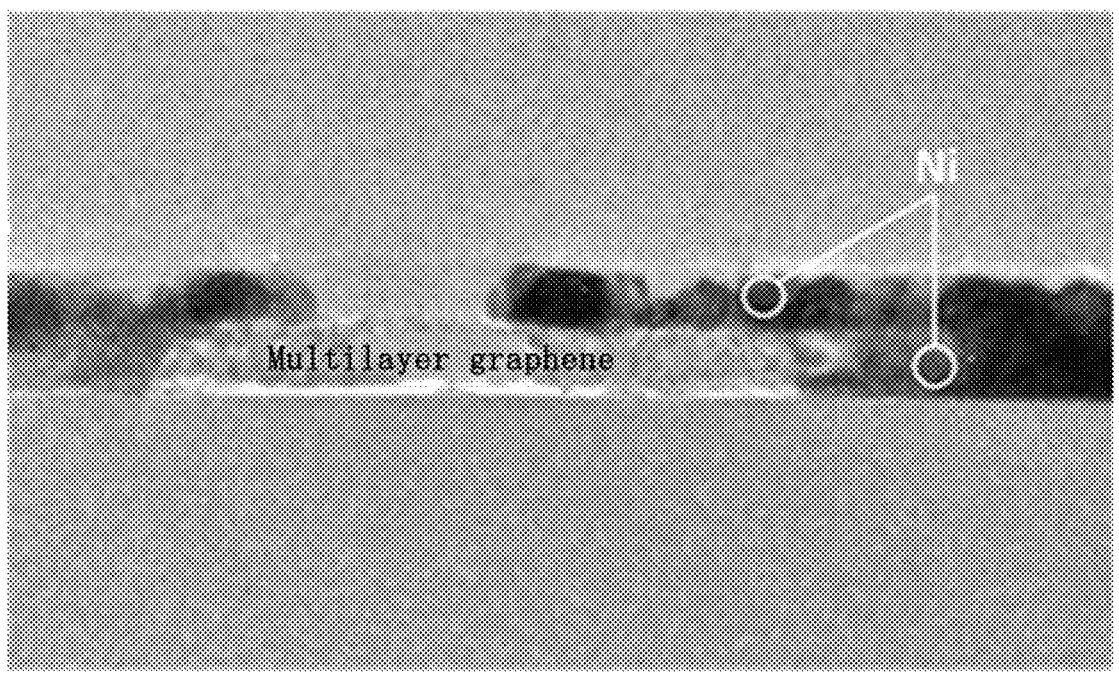
FIG. 10 is a transmission electron microscope (TEM) image showing multilayer graphene directly grown at a thickness ratio $(t_{a-c}/t_m)$ of an amorphous carbon layer to a metal catalyst layer of 0.85.
Figure 11:
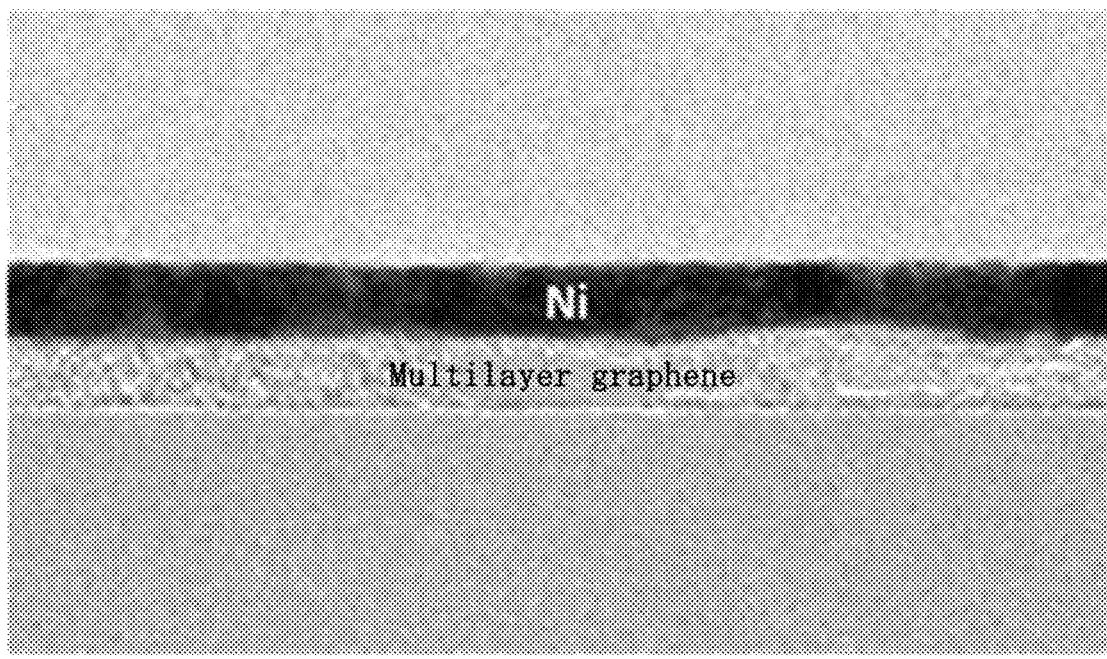
FIG. 11 is a TEM image showing multilayer graphene directly grown at a thickness ratio $(t_{a-c}/t_m)$ of an amorphous carbon layer to a metal catalyst layer of 1.

In the method for manufacturing a pellicle for extreme ultraviolet lithography using the low-temperature direct growth method of multilayer graphene according to the present disclosure, the growth of multilayer graphene depending on the thickness ratio ($t_{a-c}/t_m$) of an amorphous carbon layer to a metal catalyst layer was checked through experimental results shown in FIGS. 10 and 11. FIG. 10 is a transmission electron microscope (TEM) image showing multilayer graphene directly grown at a thickness ratio ($t_{a-c}/t_m$) of an amorphous carbon layer to a metal catalyst layer of 0.85. FIG. 11 is a TEM image showing multilayer graphene directly grown at a thickness ratio ($t_{a-c}/t_m$) of an amorphous carbon layer to a metal catalyst layer of 1.

After the amorphous carbon layer and the metal catalyst layer were formed at a thickness ratio ($t_{a-c}/t_m$) of 0.85 or 1 on the silicon substrate, the heat treatment was performed at 500° C. The etch stop layer was formed of $SiO_2$, the seed layer was formed of BN, and the metal catalyst layer was formed of Ni.

Referring to FIG. 10, when the thickness ratio ($t_{a-c}/t_m$) is 0.85, the interlayer exchange between the metal catalyst layer and the amorphous carbon layer does not proceed smoothly. As a result, it can be seen that multilayer graphene is not uniformly grown on the seed layer or that the metal catalyst layer remains in part on the seed layer.

However, referring to FIG. 11, when the thickness ratio ($t_{a-c}/t_m$) is 1, the interlayer exchange between the metal catalyst layer and the amorphous carbon layer is smoothly performed. As a result, it can be seen that the multilayer graphene is uniformly grown on the seed layer and that the metal catalyst layer is present on the grown multilayer graphene.

Therefore, it can be seen that, in order to grow the multilayer graphene through the interlayer exchange, it is necessary to form the metal catalyst layer and the amorphous carbon layer at a thickness ratio ($t_{a-c}/t_m$) of 0.9 or more.

Figure 12:
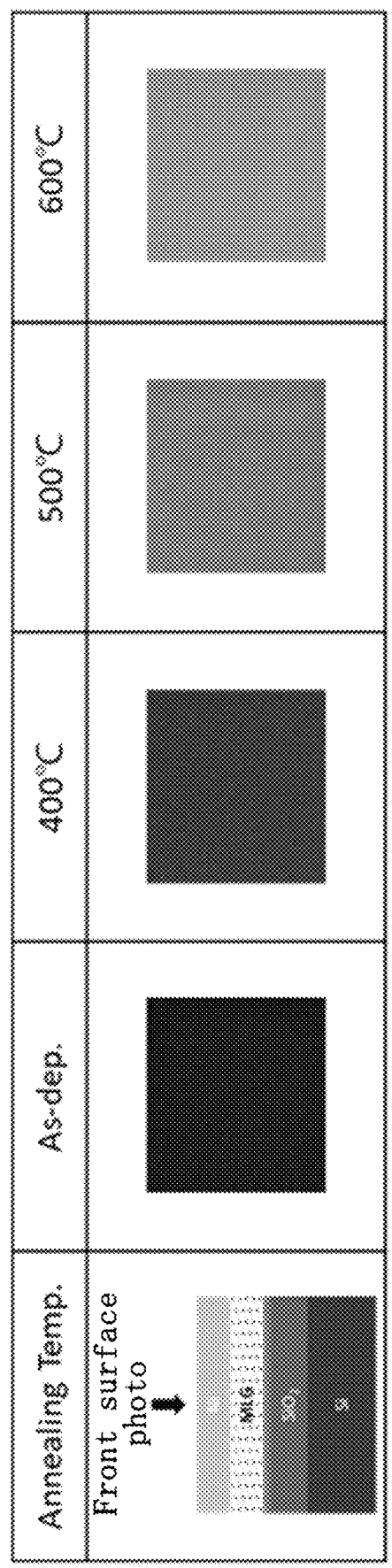
FIG. 12 is a photograph showing a change in color of a front surface of a sample according to annealing temperatures of multilayer graphene obtained by the low-temperature direct growth method.
Figure 13A:
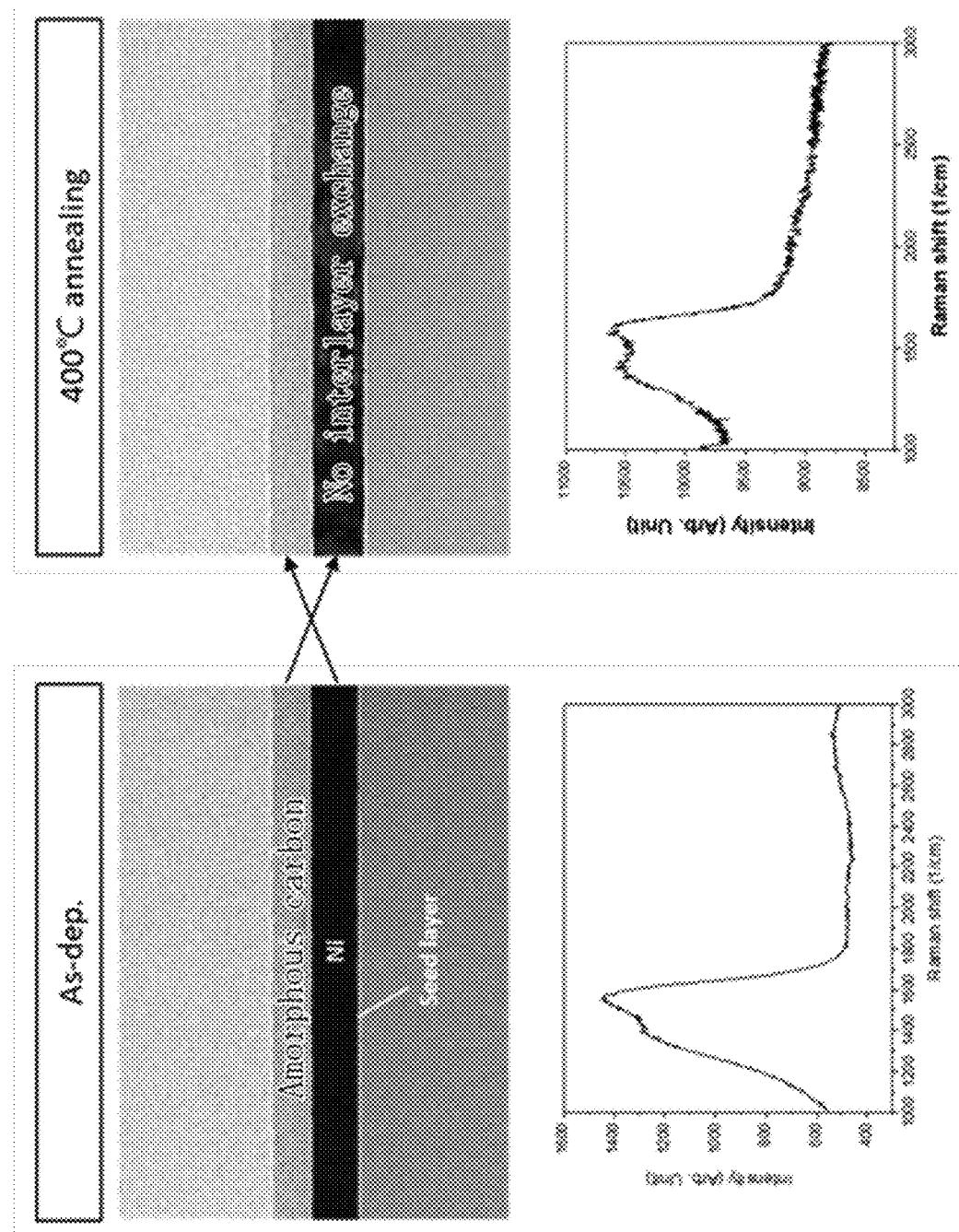
FIG. 13A and FIG. 13B show TEM images according to annealing temperatures of multilayer graphene obtained by the low-temperature direct growth method and graphs on which results measured by Raman spectroscopy are plotted.
Figure 13B:
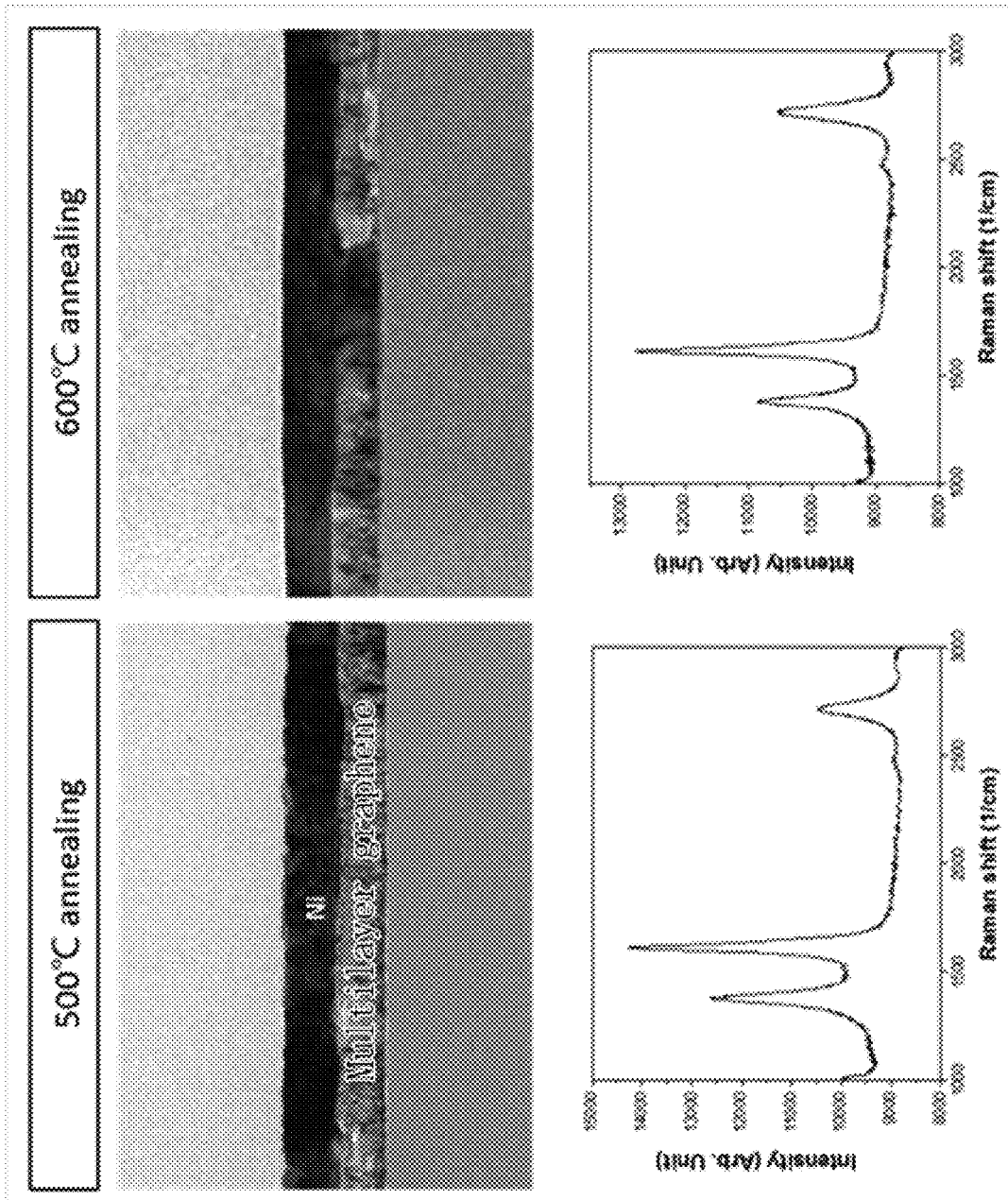

Next, in the method for manufacturing a pellicle for extreme ultraviolet lithography using the low-temperature direct growth method of multilayer graphene according to the present disclosure, the growth of multilayer graphene depending on the heat treatment temperature of the amorphous carbon layer and the metal catalyst layer was checked through experimental results shown in FIGS. 12 and 13. FIG. 12 is a photograph showing a change in color of a front surface of a sample according to annealing temperatures of multilayer graphene obtained by the low-temperature direct growth method. FIG. 13A and FIG. 13B show TEM images according to annealing temperatures of multilayer graphene obtained by the low-temperature direct growth method and graphs on which results measured by Raman spectroscopy are plotted.

In FIGS. 12, 13A, and 13B, "As-dep." denotes a state in which the seed layer, the metal catalyst layer, and the amorphous carbon layer are deposited on the silicon substrate. That is, "As-dep." represents a sample before heat treatment.

After the amorphous carbon layer and the metal catalyst layer were formed at a thickness ratio ($t_{a-c}/t_m$) of 1 on the silicon substrate, the heat treatment was performed at 400° C., 500° C., and 600° C., respectively. The etch stop layer was formed of $SiO_2$, the seed layer was formed of BN, and the metal catalyst layer was formed of Ni.

Referring to FIG. 12, it can be seen that there is no significant change in the color of the front surface of the sample between before heat treatment and after heat treatment at 400° C. That is, it can be seen from the color of the front surface of the sample that, when the heat treatment was performed at 400° C., almost no interlayer exchange occurred between the amorphous carbon layer and the metal catalyst layer.

Comparing before heat treatment and after heat treatment at 500° C. and 600° C., respectively, it can be seen that the color of the front surface of the sample is significantly changed. In addition, comparing after 500° C. heat treatment and after 600° C. heat treatment, it can be seen that the color of the front surface of the sample is similar. That is, when the heat treatment is performed at 500° C. or 600° C., it can be seen that the metal catalyst layer has moved to the front surface of the sample through the interlayer exchange between the amorphous carbon layer and the metal catalyst layer.

The growth of multilayer graphene by the interlayer exchange, confirmed through the photographs of the sample front surface, can also be confirmed from the sample TEM images and the results measured by Raman spectroscopy shown in FIG. 13A and FIG. 13B.

As shown in FIG. 13A and FIG. 13B, comparing the sample TEM images and Raman spectroscopy measurement results between before heat treatment and after 400° C. heat treatment, it can be seen that the interlayer exchange did not occur with the heat treatment at 400° C.

Also, from the sample TEM images and Raman spectroscopy measurement results after 500° C. heat treatment and after 600° C. heat treatment, it can be seen that the multilayer graphene is grown on the seed layer by the occurrence of interlayer exchange and the metal catalyst layer is located on the multilayer graphene.

Therefore, it can be seen that, when the heat treatment is performed at 450° C. to 600° C., the multilayer graphene can be formed through the interlayer exchange.

Next, in order to check the transmittance and reflectance of the pellicle according to the present disclosure in an extreme ultraviolet output environment of 350 W or more, simulation was performed for the pellicles according to the first to third embodiments manufactured by the manufacturing method according to the present disclosure as shown in FIGS. 14 to 19.

For the pellicles according to the first to third embodiments, the extreme ultraviolet transmittance and reflectance depending on a change in thickness of the core layer and the capping layer were respectively simulated. Here, as the material of the seed layer, boron-based $B_4C$ and BN were used.

Figure 14:
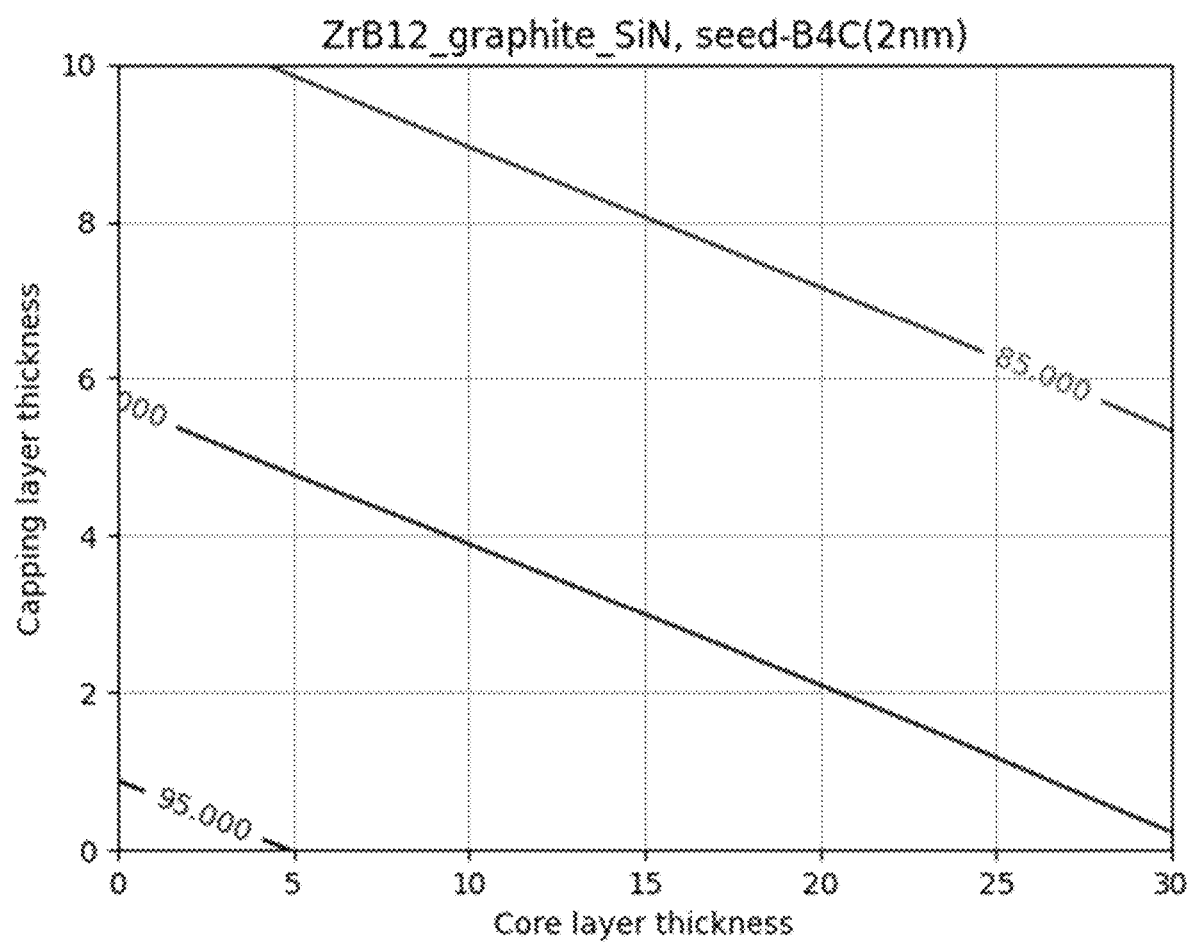
FIG. 14 is a graph showing the extreme ultraviolet transmittance of a pellicle according to the first embodiment.
Figure 15:
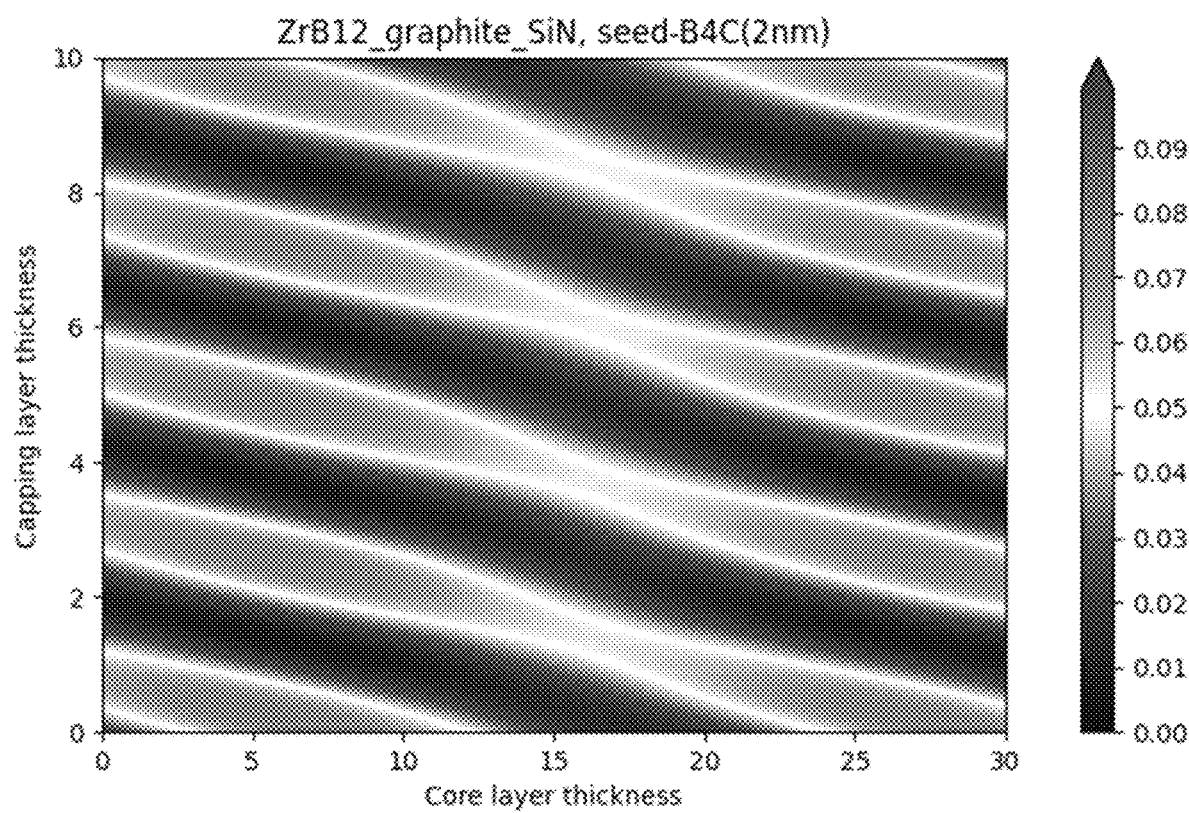
FIG. 15 is a graph showing the extreme ultraviolet reflectance of a pellicle according to the first embodiment.

FIG. 14 is a graph showing the extreme ultraviolet transmittance of a pellicle according to the first embodiment. FIG. 15 is a graph showing the extreme ultraviolet reflectance of a pellicle according to the first embodiment.

Referring to FIGS. 14 and 15, the pellicle according to the first embodiment has a structure in which an etch stopper of $SiN_x$, a seed layer of $B_4C$, a core layer of multilayer graphene, and a capping layer of $ZrB_{12}$ are formed on a silicon substrate. The seed layer was formed to have a thickness of 2 nm. The pellicle according to the first embodiment was expressed as "$ZrB_{12}$_graphite_SiN, seed-$B_4C$(2 nm)".

It can be seen that the pellicle according to the first embodiment provides an extreme ultraviolet transmittance of 85% or more when the capping layer has a thickness of 10 nm or less and the core layer has a thickness of 30 nm or less.

It can be seen that the pellicle according to the first embodiment provides a reflectance of 0.05% or less when the capping layer has a thickness of 10 nm or less and the core layer has a thickness of 12 to 20 nm.

Therefore, it can be seen that the pellicle according to the first embodiment provides an extreme ultraviolet transmittance of 85% or more and a reflectance of 0.05% or less when the capping layer has a thickness of 1 nm to 10 nm and the core layer has a thickness of 12 nm to 20 nm.

Figure 16:
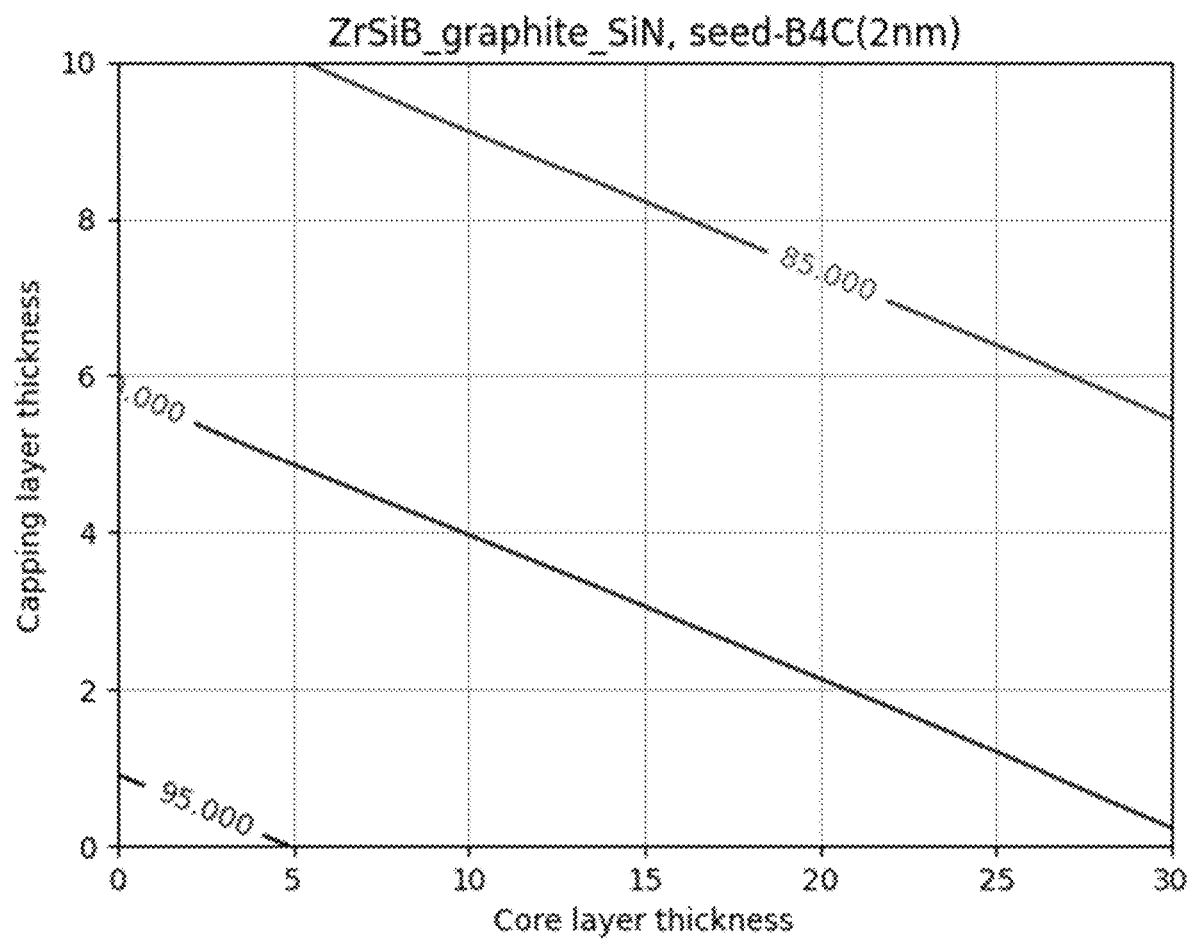
FIG. 16 is a graph showing the extreme ultraviolet transmittance of a pellicle according to the second embodiment.
Figure 17:
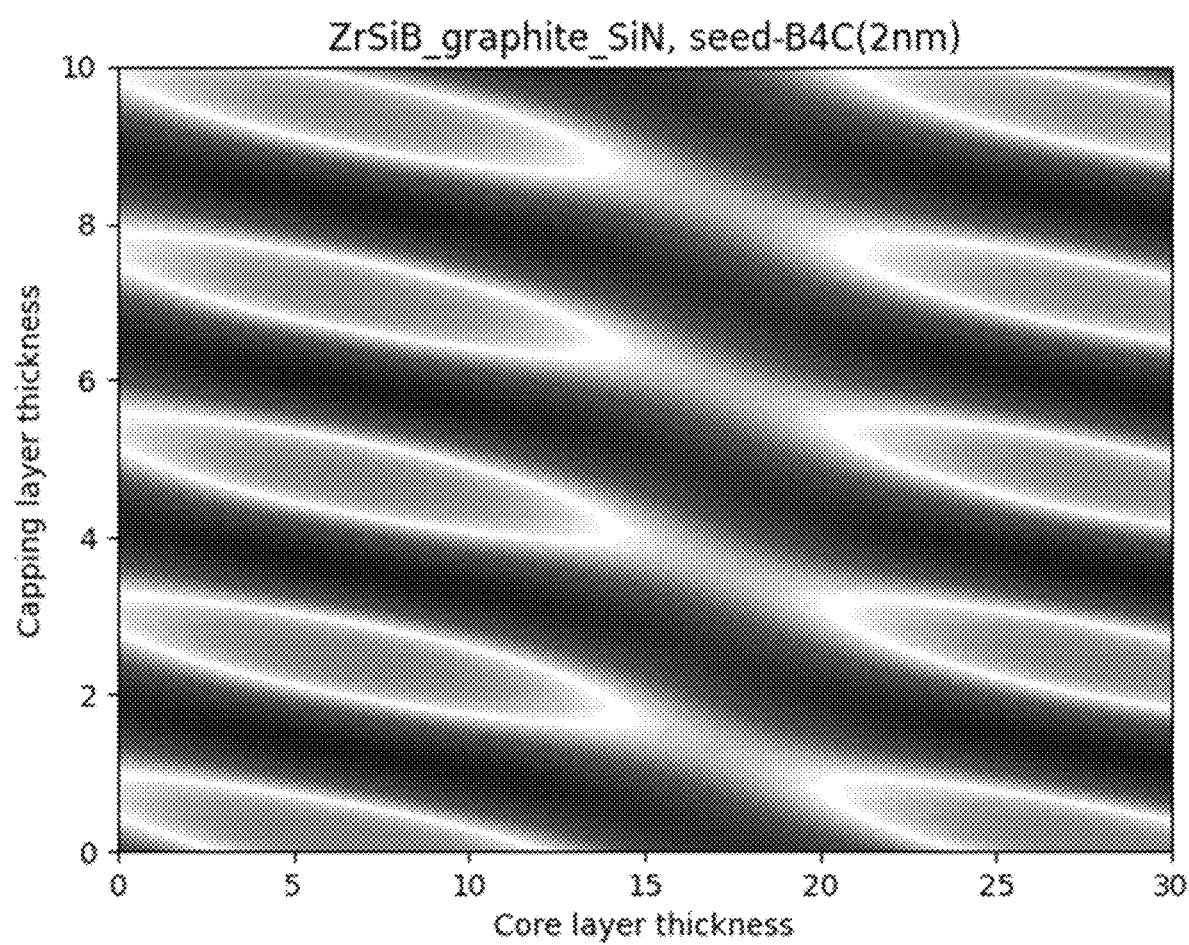
FIG. 17 is a graph showing the extreme ultraviolet reflectance of a pellicle according to the second embodiment.

FIG. 16 is a graph showing the extreme ultraviolet transmittance of a pellicle according to the second embodiment. FIG. 17 is a graph showing the extreme ultraviolet reflectance of a pellicle according to the second embodiment.

Referring to FIGS. 16 and 17, the pellicle according to the second embodiment has a structure in which an etch stopper of $SiN_x$, a seed layer of $B_4C$, a core layer of multilayer graphene, and a capping layer of ZrSiB are formed on a silicon substrate. The seed layer was formed to have a thickness of 2 nm. The pellicle according to the second embodiment was expressed as "ZrSiB_graphite_SiN, seed-$B_4C$(2 nm)".

It can be seen that the pellicle according to the second embodiment provides an extreme ultraviolet transmittance of 85% or more when the capping layer has a thickness of 10 nm or less and the core layer has a thickness of 30 nm or less.

It can be seen that the pellicle according to the second embodiment provides a reflectance of 0.05% or less when the capping layer has a thickness of 10 nm or less and the core layer has a thickness of 13 to 20 nm.

Therefore, it can be seen that the pellicle according to the second embodiment provides an extreme ultraviolet transmittance of 85% or more and a reflectance of 0.05% or less when the capping layer has a thickness of 1 nm to 10 nm and the core layer has a thickness of 13 nm to 20 nm.

Figure 18:
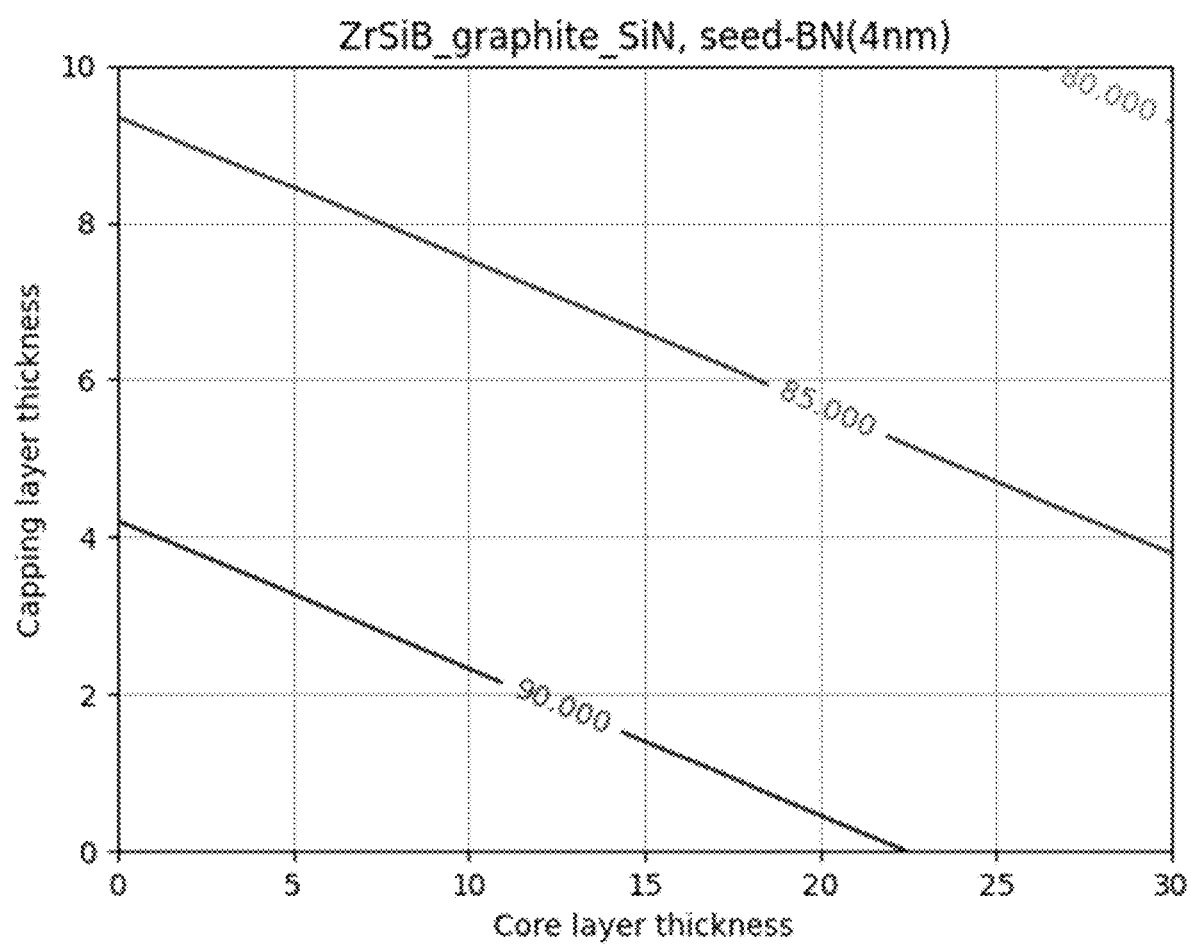
FIG. 18 is a graph showing the extreme ultraviolet transmittance of a pellicle according to the third embodiment.
Figure 19:
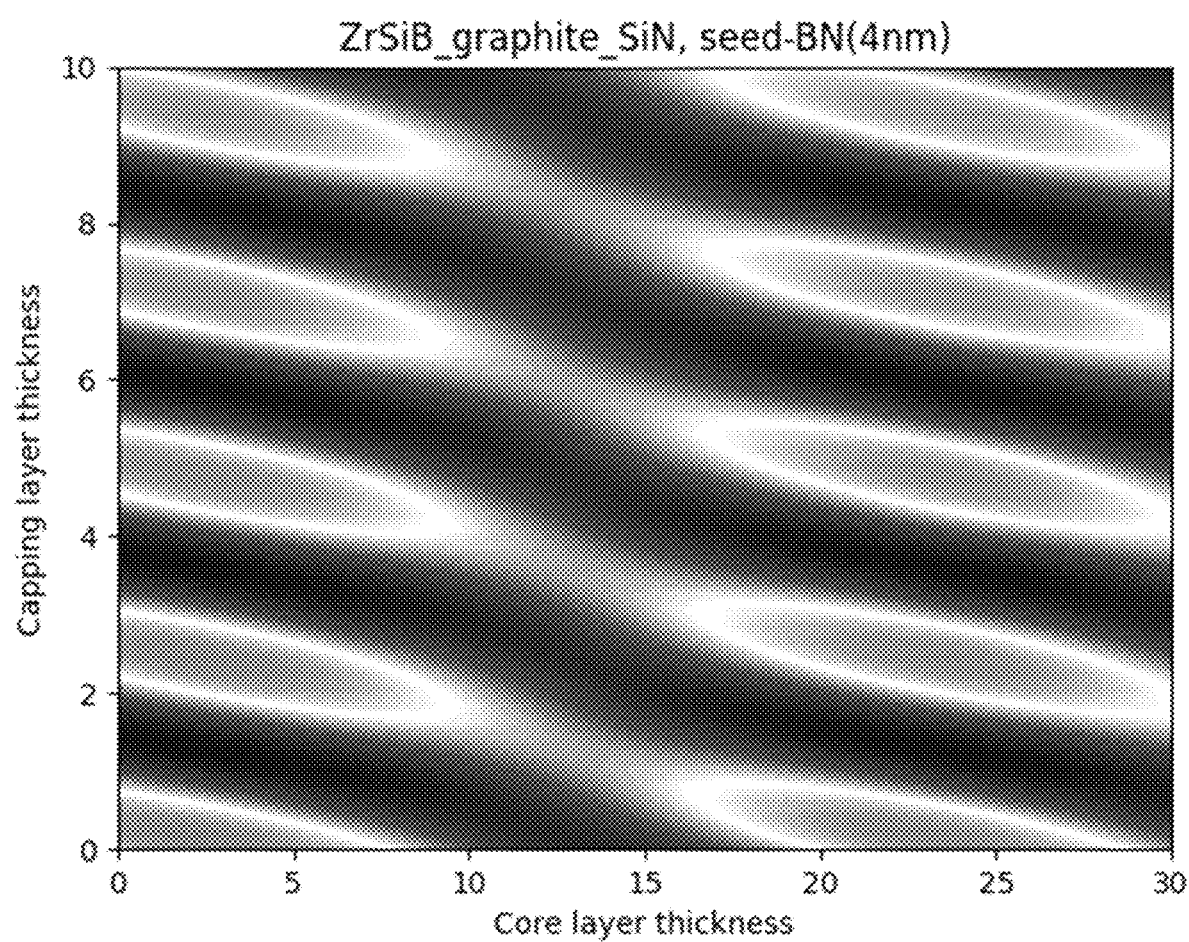
FIG. 19 is a graph showing the extreme ultraviolet reflectance of a pellicle according to the third embodiment.

FIG. 18 is a graph showing the extreme ultraviolet transmittance of a pellicle according to the third embodiment. FIG. 19 is a graph showing the extreme ultraviolet reflectance of a pellicle according to the third embodiment.

Referring to FIGS. 18 and 19, the pellicle according to the third embodiment has a structure in which an etch stopper of $SiN_x$, a seed layer of BN, a core layer of multilayer graphene, and a capping layer of ZrSiB are formed on a silicon substrate. The seed layer was formed to have a thickness of 4 nm. The pellicle according to the third embodiment was expressed as "ZrSiB_graphite_SiN, seed-BN(4 nm)".

It can be seen that the pellicle according to the third embodiment provides an extreme ultraviolet transmittance of 85% or more when the capping layer has a thickness of 9 nm or less and the core layer has a thickness of 30 nm or less.

It can be seen that the pellicle according to the third embodiment provides a reflectance of 0.05% or less when the capping layer has a thickness of 10 nm or less and the core layer has a thickness of 8 to 17 nm.

Therefore, it can be seen that the pellicle according to the third embodiment provides an extreme ultraviolet transmittance of 85% or more and a reflectance of 0.05% or less when the capping layer has a thickness of 1 nm to 9 nm and the core layer has a thickness of 8 nm to 17 nm.

As described above, even though multilayer graphene is used as the core layer and also the etch stopper and the capping layer are formed as protective layers on both sides of the core layer, the pellicle according to embodiments of the present disclosure can provide a higher extreme ultraviolet transmittance of 85% or more when the core layer has a thickness of 10 nm to 20 nm.

Accordingly, the pellicle using multilayer graphene as the core layer as in the embodiments can provide an extreme ultraviolet transmittance of 85% or more and a reflectance of 0.05% or less.

While the present disclosure has been particularly shown and described with reference to an exemplary embodiment thereof, it will be understood by those skilled in the art that various changes in form and details may be made therein without departing from the scope of the present disclosure as defined by the appended claims.

What is claimed is:

1. A low-temperature direct growth method of multilayer graphene, the method comprising:
   forming an etch stopper on a substrate;
   forming a seed layer on the etch stopper, the seed layer including at least one of amorphous boron, BN, BCN, $B_4C$, or Me-X (Me is at least one of Si, Ti, Mo, or Zr, and X is at least one of B, C, or N);
   forming a metal catalyst layer on the seed layer;
   forming an amorphous carbon layer on the metal catalyst layer; and
   directly growing multilayer graphene on the seed layer through interlayer exchange between the metal catalyst layer and the amorphous carbon layer by performing a low-temperature heat treatment at 450° C. to 600° C.

2. The method of claim 1, wherein a material of the etch stopper includes at least one of $SiN_x$, $SiO_2$, SiC, or $Mo_2C$.

3. The method of claim 1, wherein the seed layer is formed by depositing to a thickness of 5 nm or less.

4. The method of claim 1, wherein the metal catalyst layer includes at least one of Ni, Co, Fe, Pt, Ir, Ru, Cr, or Mn.

5. The method of claim 4, wherein the metal catalyst layer is formed to have a thickness of 10 nm to 100 nm by a sputtering process or an e-beam evaporation process.

6. The method of claim 1, wherein a ratio ($t_{a-c}/t_m$) of the amorphous carbon layer thickness ($t_{a-c}$) to the metal catalyst layer thickness ($t_m$) is 0.9 or more.

7. The method of claim 1, wherein when directly growing the multilayer graphene, the heat treatment is performed for 30 minutes to 4 hours in a hydrogen gas and inert gas atmosphere, and the inert gas includes at least one of nitrogen, argon, and helium.

8. The method of claim 1, further comprising:
   after directly growing the multilayer graphene, removing the metal catalyst layer on the multilayer graphene.

9. The method of claim 8, further comprising:
   after directly growing the multilayer graphene and before removing the metal catalyst layer, removing the amorphous carbon layer remaining on the metal catalyst layer through $O_2$ plasma treatment.

10. The method of claim 1, wherein the multilayer graphene has a thickness of 20 nm or less.

* * * * *